(12) United States Patent
Shenoy (10) Patent No.: US 6,304,150 B1
(45) Date of Patent: Oct. 16, 2001

(54) DOUBLE-CLAMPED DELAY STAGE AND VOLTAGE CONTROLLED OSCILLATOR

(75) Inventor: Ravindra Shenoy, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/354,685

(22) Filed: Jul. 15, 1999

(51) Int. Cl.[7] ................................. H03B 5/24; H03K 3/00
(52) U.S. Cl. ..................... 331/57; 331/177 R; 331/175; 327/280; 327/287
(58) Field of Search ......................... 331/34, 57, 111, 331/116 R, 116 FE, 117 R, 117 FE, 117 D, 143, 175, 177 R; 327/274, 280, 287; 330/252, 257

(56) References Cited

U.S. PATENT DOCUMENTS

| | | | |
|---|---|---|---|
| 4,268,762 | * 5/1981 | Ienaka et al. | 307/268 |
| 4,893,036 | * 1/1990 | Hester et al. | 307/603 |
| 5,206,609 | * 4/1993 | Mijuskovic | 331/57 |
| 6,081,166 | * 6/2000 | Katakura | 331/57 |

OTHER PUBLICATIONS

Cideciyan, Roy D.; Dolivo, Francois; Hermann, Reto; Hirt, Walter, "A PRML System for Digital Magnetic Recording", Jan. 1, 1992, IEEE Journal on Selected Areas in Communications, pp 38–56.

* cited by examiner

*Primary Examiner*—David Mis (57) ABSTRACT

A delay cell, a method for generating a delay, and a differential ring oscillator are disclosed. The delay cell provides a stable delay with a low voltage power supply, and has a high power supply rejection ratio. The delay cell generally comprises a first and second input receiver on a first and second branch, respectively, to receive an input to control a current on each branch, each branch includes an output node capacitively coupled to a power supply. Each branch may include a current source coupled between the output node and the power supply and/or a lower limit clamp coupled between the output node and the power supply to maintain an output at the output node above a lower limit. The delay cell may also include a first and a second current diverter coupled to the first and second branch for diverting current on the first and second branch away from the first and second input receiver, respectively. An upper limit clamp may be coupled between the power supply and the first and second current diverters to maintain the output below an upper limit. Inputs to the lower and upper limit clamps may be generated relative to the power supply. The delay cell may further include a tail current source coupled between ground and the input receivers and an upper clamp current source coupled between ground and the first and second current diverters.

14 Claims, 4 Drawing Sheets

DOUBLE-CLAMPED DELAY STAGE AND VOLTAGE CONTROLLED OSCILLATOR

BACKGROUND OF THE INVENTION

1. Field of the Invention

The present invention relates generally to a delay cell. More specifically, a highly linear double-clamped delay cell with low jitter, high power-supply-rejection, and low supply voltage capabilities is disclosed.

2. Description of Related Art

Delay cells are used in phase-locked loops (PLL). A phase-locked loop generally comprises a phase detector, a low-pass filter, and a voltage-controlled oscillator (VCO). The VCO is an oscillator that produces a periodic wave form as an output signal, the frequency of which may be varied about some free-running frequency depending upon the value of the applied voltage. The free-running frequency is the frequency of the oscillator signal or the VCO output when the applied voltage is 0.

The phase detector receives an incoming signal and the oscillator output signal of the VCO and produces a phase detector output signal. The phase detector output signal represents the phase difference between the incoming and oscillator signals. The phase detector output signal is filtered through the low pass filter. The output of the low pass filter is the output of the PLL and the applied voltage to the VCO used to change the frequency of the VCO output. The closed-loop operation of the circuit maintains the VCO frequency locked to that of the incoming signal frequency.

If the applied signal of the VCO has the free-running frequency as an initial frequency, the PLL will acquire lock and the VCO will track the incoming signal frequency over some range, provided that the incoming signal frequency changes slowly. However, the loop will remain locked only over some finite range of frequency shift.

When the loop is operating in lock, the incoming signal and the VCO output signal fed to the phase comparator are of the same frequency, although not necessarily in phase. When the loop is trying to achieve lock, the output of the phase comparator contains frequency components at the sum and difference of the signals compared. The low-pass filter passes only the lower frequency component of the signals so that loop can obtain lock between incoming and VCO signals.

During lock, the output of the low-pass filter is the value needed to hold the VCO in lock with the incoming signal. The VCO then outputs a fixed amplitude wave signal at the frequency of the incoming signal. A fixed phase difference between the incoming and the VCO output signals to the phase comparator results in a fixed applied voltage to the VCO. Changes in the incoming signal frequency then results in change in the applied voltage to the VCO.

The limited operating range of the VCO and the feedback connection of the PLL circuit results in two frequency bands specified for a PLL: a capture range and a lock range. The capture range of the PLL is the frequency range centered about the VCO free-running frequency over which the loop can acquire lock with the input signal. The lock range of the PLL is generally wider than the capture range and is the range over which the PLL can maintain lock with the incoming signal once the PLL achieves capture. Within the capture-and-lock frequency ranges, the applied voltage drives the VCO frequency to match that of the incoming signal.

A PLL can be used in a wide variety of applications, including (1) modems, telemetry receivers and transmitters, tone decoders, AM detectors, and tracking filters; (2) demodulation of two data transmission or carrier frequencies in digital-data transmission used in frequency-shift keying (FSK) operation; (3) frequency synthesizers that provide multiples of a reference signal frequency (e.g. the carrier for the multiple channels of the citizen's band (CB) unit or marine-radio-band unit can be generated using a single-crystal-controlled frequency and its multiples generated using a PLL); and (4) FM demodulation networks for FM operation with excellent linearity between the input signal frequency and the PLL output voltage.

One example of a VCO implementation is a multiple-stage differential ring oscillator constructed using identical delay stages. Because each of the multiple stages are identical in construction, the delay of each stage is assumed to be the same. In such a differential ring design, the frequency of the VCO output signal is 1/(2 ×number of stages ×the delay of each stage). Thus, the frequency of the VCO output signal is 1/(8 ×the delay of each stage) for a four-stage differential ring oscillator.

The performance of such a differential ring oscillator is highly dependent on the consistency of the delay provided by each of the delay cells. In general, a delay may be provided by charging a delay capacitor to a given voltage using a stable current source. Variance in delay is introduced in currently available designs by a number of factors. One such factor is changes in the power supply voltage that cause the voltage on the delay capacitor to change. Any change in the delay in one or more of the delay cells caused by such an outside effect degrades the performance of the oscillator because instability is introduced in the frequency.

What is needed is a more robust delay cell that generates a substantially invariant delay. Ideally, the delay should be independent of variations in factors that are difficult to control such as the supply voltage temperature, and device characteristics that vary as a result of the manufacturing process. It is also desirable to provide delay cells that are highly tunable, resulting in a very linear VCO. It is further desirable to provide delay cells with low jitter and low supply voltage operation.

SUMMARY OF THE INVENTION

A delay cell is disclosed that provides a very stable delay. The delay cell is capable of operating with a low voltage power supply and has a high power supply rejection ratio, that is, the delay varies little with changes in the power supply output voltage. The design of the delay cell is such that any degradation to the performance caused by variances in the operating temperature and/or manufacturing process is minimized.

In one embodiment, the delay cell comprises a first input receiver on a first branch and a second input receiver on a second branch. The first input receiver receives a first input to control a first current on the first branch, the first branch having a first output node capacitively coupled to a power supply. The second input receiver receives a second input to control a second current on the second branch, the second branch having a second output node capacitively coupled to the power supply. The delay cell may further comprise a first current source coupled between the first output node and the power supply and a second current source coupled between the second output node and the power supply.

Preferably, the delay cell also includes a first clamp coupled between the first output node and the power supply for maintaining a first output at the first output node above a lower limit and a second clamp coupled between the second output node and the power supply for maintaining a second output at the second output node above the lower limit. The delay cell further comprise a first clamp input for supplying an input to the first clamp and a second clamp input for supplying an input to the second clamp, the clamp inputs being generated relative to the power supply.

In another preferred embodiment, the delay cell includes a tail current source coupled between ground and the first and second input receivers. Each of the first and second input receivers may be a bipolar junction transistor.

The delay cell may further include a first current diverter coupled to the first branch for diverting current on the first branch away from the first input receiver and a second current diverter coupled to the second branch for diverting current on the second branch away from the second input receiver. Each of the first and second current diverters may be a diode.

Preferably, the delay cell also includes an upper limit clamp coupled between the power supply and the first and second current diverters that maintains each of a first output at the first output node and a second output at the second output node below an upper limit. An upper clamp input supplied to the upper limit clamp may be generated relative to the power supply. An upper clamp current source may also be coupled between ground and the first and second current diverters.

In another embodiment, a method for generating a delay comprises inputting a first input to a first input receiver on a first branch to control a first current on the first branch, inputting a second input into a second input receiver on a second branch to control a second current on the second branch, providing a first current source to supply current on the first branch, providing a second current source to supply current on the second branch, outputting a first output at a first output node on the first branch, the first output node is capacitively coupled to a power supply; and outputting a second output at a second output node on the second branch, the second output node is capacitively coupled to the power supply.

In yet another embodiment, a differential ring oscillator comprises a first delay cell and a second delay cell, each delay cell adapted to receive a first input and a second input and each delay cell having a first output node and a second output node. The delay cells are configured in a ring configuration such that the first and second output nodes of the first delay cell are coupled to the first and second inputs of the second delay cell, respectively. Further, the first and second output nodes of the second delay cell are coupled to the second and first inputs of the first delay cell, respectively.

In yet another embodiment, a differential ring oscillator comprises a first delay cell, one or more intermediate delay cells, and a last delay cell. Each delay cell is adapted to receive a first input and a second input and each delay cell having a first output node and a second output node. The delay cells are configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively. In one preferred embodiment, the intermediate delay cells comprise two delay cells.

BRIEF DESCRIPTION OF THE DRAWINGS

The present invention will be readily understood by the following detailed description in conjunction with the accompanying drawings, wherein like reference numerals designate like structural elements, and in which.

DESCRIPTION OF SPECIFIC EMBODIMENTS

A delay cell and a voltage-controlled oscillator (VCO) incorporating the delay cell are disclosed. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
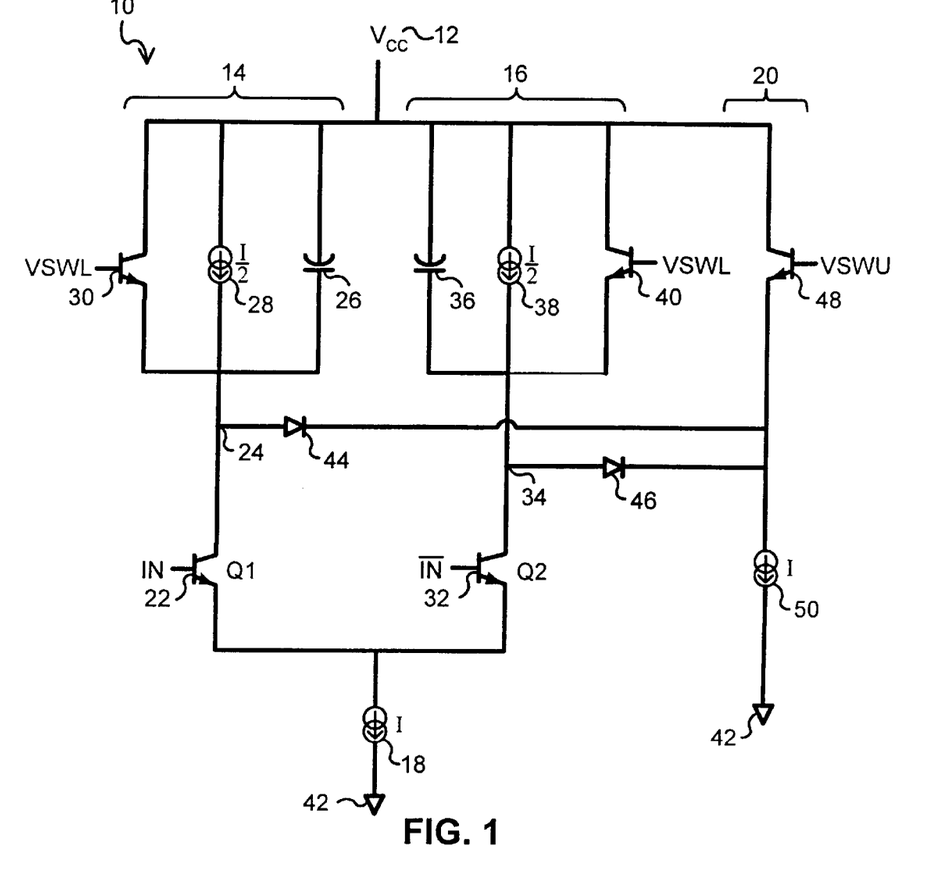
FIG. 1 is a circuit diagram of a delay circuit of the present invention.

FIG. 1 is a simplified circuit diagram of a differentially coupled delay cell or circuit 10. The delay circuit 10 comprises a power supply 12 for supplying a supply voltage $V_{CC}$, a first branch 14, a second branch 16, and a tail current source 18. The tail current source 18 is coupled between ground 42 and the first and second branches 14, 16. The delay circuit 10 may further comprise a third branch 20.

The first branch 14 includes a first input receiver 22 for receiving a first input IN to control a first current on the first branch 14. The first branch 14 has a first clamped node 24. The first branch 14 further includes a first timing capacitor 26, a first current source 28, and a first lower limit clamp 30, each of which is coupled between the power supply 12 and the first clamped node 24.

The second branch 16 includes a second input receiver 32 for receiving a second input $\overline{\text{IN}}$ to control a second current on the second branch 16. The second branch 16 has a second clamped node 34. The second branch 16 further includes a second timing capacitor 36, a second current source 38, and a second lower limit clamp 40, each of which is coupled between the power supply 12 and the second clamped node 34.

The delay circuit further comprises a first current diverter or diode 44 coupled to the first branch 14 at the first clamped node 24 for diverting current on the first branch 14 away from the first input receiver 22, and a second current diverter or diode 46 coupled to the second branch 16 at the second clamped node 34 for diverting current on the second branch 16 away from the second input receiver 32. The first and second current diverters 44, 46 are coupled to the third branch 20. The third branch 20 may comprise an upper limit clamp 48 coupled between the power supply 12 and the first and second current diverters 44, 46, and an upper clamp current source 50 coupled between ground 42 and the first and second current diverters 44, 46.

Figure 2:
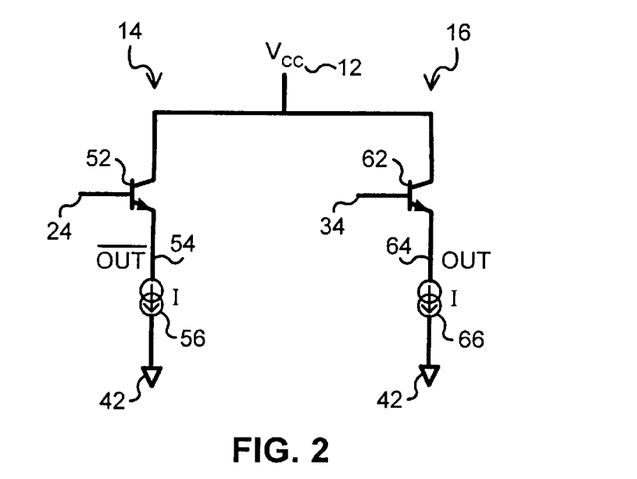
FIG. 2 is a circuit diagram of an output emitter follower circuit.

Each of the first and second branches 14, 16 of the delay circuit 10 further comprises an output emitter follower circuit shown in FIG. 2. The output emitter follower circuit of the first branch 14 includes a first output transistor 52 coupled between the power supply 12 and a first output node 54 at which the first output $\overline{\text{OUT}}$ is taken. The first clamped node 24 is coupled to the base of the first output transistor 52. The output emitter follower circuit of the first branch 14 further includes a first output current source 56 coupled between the first output node 54 and ground 42.

Similarly, the output emitter follower circuit of the second branch 16 includes a second output transistor 62 coupled between the power supply 12 and a second output node 64 at which the first output OUT is taken. The second clamped node 34 is coupled to the base of the second output transistor 62. The output emitter follower circuit of the second branch 16 further includes a second output current source 66 coupled between the first output node 54 and ground 42.

Each of the first and second input receivers 22, 32, the first and second lower limit clamps 30, 40, the upper limit clamp 48, and the first and second output transistors 52, 62 is preferably a bipolar junction transistor (BJT). Preferably, the bipolar junction transistors for the first and second input receivers 22, 32 are of generally identical construct. Similarly, the bipolar junction transistors for the first and second lower limit clamps 30, 40 are preferably of generally identical construct. Further, the bipolar junction transistors for the first and second output transistors 52, 62 are preferably of generally identical construct.

A voltage swing low input of VSWL may be applied to each of the first and second lower limit clamps 30, 40 and a voltage swing high input of VSWU may be applied to the upper limit clamp 48. Input voltage to the first and second lower limit clamps 30, 40 serve to maintain or clamp the voltages at the first and second clamped nodes 24, 34 at or above a minimum voltage $V_{MIN}$.

Voltage swing inputs VSWL and VSWU are selected depending upon the desired time delay τ. The greater the difference between input voltages VSWL and VSWU, the longer the time delay τ. Input voltage VSWU to the upper limit clamp 48 is greater than input voltage VSWL by an amount greater than the base-emitter voltage $V_{BE}$ of the transistors. $V_{BE}$ is the base-emitter voltage when the transistor is in an "on" state (the "threshold" base-emitter voltage) and is approximately 0.75 V in the typical range of current flow for the delay cell 10. Preferably, the input voltage VSWU to the upper limit clamp 48 is approximately equal to the power supply voltage $V_{cc}$ less approximately 0.75 V. Further, the input voltage VSWL to each of the first and second lower limit clamps 30, 40 is preferably approximately equal to the power supply voltage $V_{cc}$ less 0.5 V.

Because the timing capacitors 26, 36 are differentially clamped between a minimum and a maximum voltage that are related to the input voltages VWSU and VSWL generated relative to the power supply voltage $V_{cc}$, variations in the power supply voltage $V_{cc}$ result in similar variation in both input voltages VSWU and VSWL. Thus, the delay circuit 10 has high rejection of changes in the power supply voltage $V_{cc}$. The power supply voltage $V_{cc}$ may be approximately 3 V although variations of the power supply voltage $V_{cc}$ should not affect the delay cell output voltages. Further, double clamping of the output voltages enables the delay stage 10 to have a highly linear relationship between the delay and the current I through the tail current source 18. Thus, the delay is highly tunable by adjusting the current I through the tail current source 18.

Each of the first and second lower limit clamps 30, 38 serves to limit the voltage at the first and second clamped nodes 24, 34 from dropping below a minimum or a lower limit threshold voltage $V_{MIN}$. $V_{MIN}$ is equal to the lower limit clamp input VSWL less the base-emitter junction voltage $V_{BE}$ of the respective lower limit clamp 30, 40 when the lower limit clamp is in an "on" state. The upper limit clamp 48 having an input VSWU serves to limit the voltages at the first and second clamped nodes 24, 34, respectively, to a maximum or an upper limit voltage $V_{MAX}$. $V_{MAX}$ is equal to the upper limit clamp input VSWU. The voltage $V_{cc}$ of the power supply 12, the voltage input VSWL to the first and second lower limit clamp 30, 40, as well as the voltage input VSWU to the upper limit clamp 48 may be selected to produce the desired maximum and minimum voltage limits $V_{MAX}$ and $V_{MIN}$ at the first and second clamped nodes 24, 34. In other words, each of the first and second lower limit clamps 30, 40 serves to clamp the voltage at nodes 24, 34, respectively, to a minimum voltage $V_{MIN}$ while the upper limit clamp 48 serves to clamp the voltage at nodes 24, 34 to a maximum voltage $V_{MAX}$.

Referring again to FIG. 2, because the maximum voltage at clamped nodes 24, 34 is $V_{MAX}$, the high voltage $V_{HIGH}$ for outputs $\overline{\text{OUT}}$, OUT taken at nodes 54, 64 is $V_{MAX}$ less the base-emitter voltage $V_{BE}$ of the respective first and second output bipolar junction transistor 52, 62. $V_{MAX}$ is equal to VSWU as derived above and $V_{BE}$ is equal to 0.75 V such that $V_{HIGH}$ is equal to VSWU minus 0.75 V. In addition, because the minimum voltage at clamped nodes 24, 34 is $V_{MIN}$, the low voltage $V_{LOW}$ for outputs $\overline{\text{OUT}}$, OUT taken at nodes 54, 64 is $V_{MIN}$ less the base-emitter voltage $V_{BE}$ of the respective first and second output bipolar junction transistor 52, 62. $V_{MIN}$ is equal to VSWL less $V_{BE}$ as derived above and $V_{BE}$ is equal to 0.75 V such that $V_{LOW}$ is equal to VSWL minus 1.5 V.

Each of the first and second capacitors 28, 38 of the first and second branches 14, 16 capacitively couples the first and second clamped nodes 24, 34, respectively, to the power supply 12. Such a configuration of the first and second capacitors 26, 36 advantageously removes the effects of any parasitic capacitance of the timing capacitors 26, 36. The minimization or removal of parasitic capacitance to the integrated circuit substrate of the delay circuit 10 reduces jitter induced by switching noises that may exist on the power supply rails.

In addition, each of the tail and upper clamp current sources 18, 50 preferably has a current of amplitude I while each of the first and second current sources 28, 38 preferably has a current of I/2, i.e. one-half the current of each of the tail and upper clamp current sources 18, 50. The first and second current sources 28, 38 serve to charge the first and second timing capacitors 26, 36, respectively. The first and second output current sources 56, 66 preferably also has a current I. Preferably, the current I is generated using an off-chip resistor invariant to integrated circuit manufacturing variances.

The delay generated by the delay circuit 10 is dependent upon the amplitude of current I, the capacitance of the first and second timing capacitors 26, 36, as well as the voltage swing of the delay circuit 10. The voltage swing of the delay circuit 10 is a function of the difference between voltage inputs VSWU and VSWL.

Figure 3:
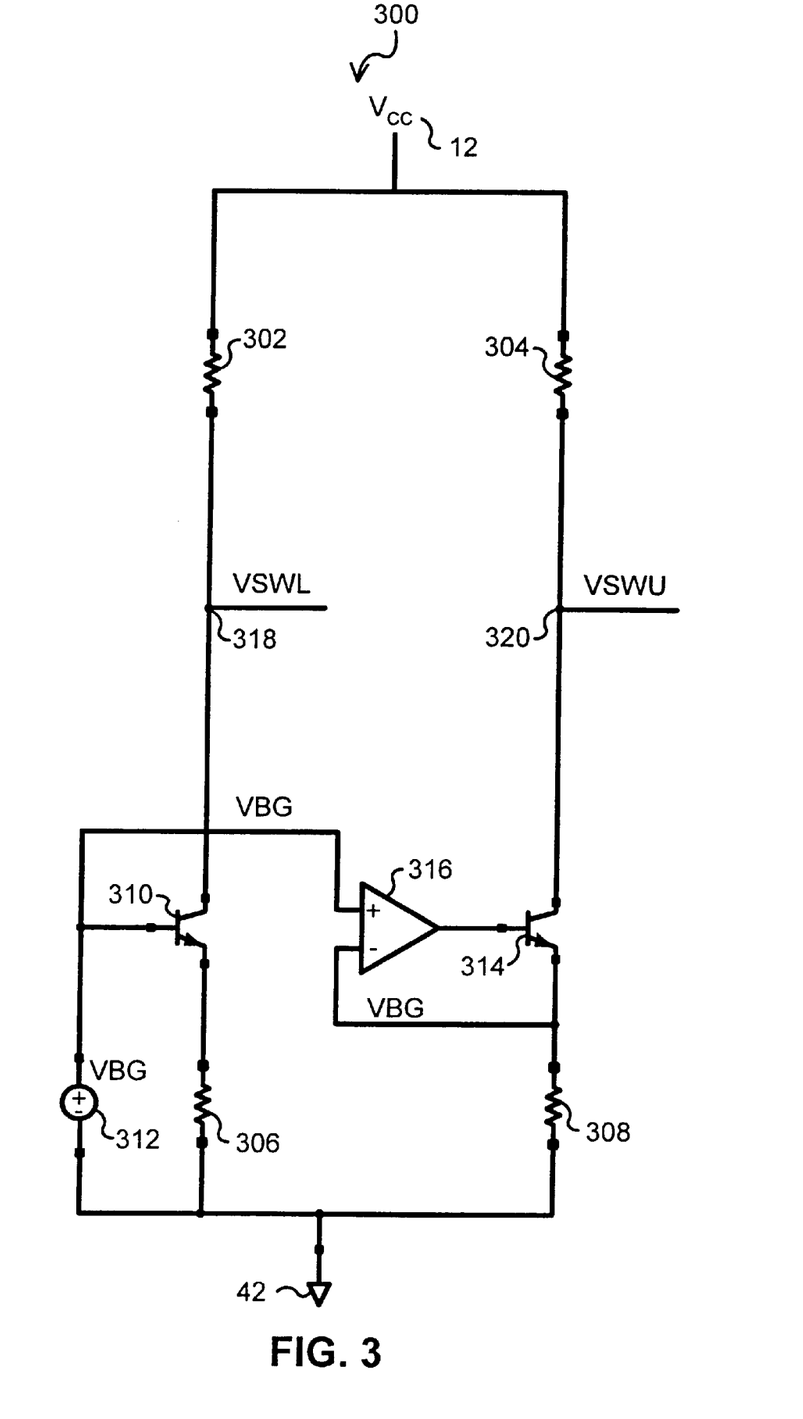
FIG. 3 is a circuit diagram of a circuit for generating VSWL and VSWU.

FIG. 3 is a circuit diagram of a circuit 300 for generating input voltages VSWL and VSWU. The input voltage generation circuit 300 is coupled between the power supply 12 and ground 42. The input voltage generation circuit 300 generally comprises resistors 302, 304, 306, 308 and a bipolar junction transistor 310 having its collector, emitter and base coupled to resistors 302, 306 and VBG band gap voltage 312, respectively. Resistors 302, 304 are coupled to the power supply 12 and resistors 306, 308 are coupled to the ground 42.

The input voltage generation circuit 300 further comprises a bipolar junction transistor 314 having its collector, emitter and base coupled to resistors 304, 308 and output from an amplifier 316, respectively. The amplifier 316 has $V_{BG}$ band gap voltage 312 as its non-inverting input and a feedback from the base node of the transistor 314 as its inverting input. The input voltage VSWL to the first and second lower limit clamps 30, 40 is taken at node 318 between the resistor 302 and the collector of the bipolar junction transistor 310. Node 318 is coupled to the inputs of the first and second input transistors 30, 40 (shown in FIG. 1). The input voltage VSWU to the upper limit clamp 48 is taken at a node 320 between the resistor 304 and the collector of the bipolar junction transistor 314. Node 320 is coupled to the input of the output transistors 48 (shown in FIG. 1).

Thus, the input voltages VSWL, VSWU and the current $I_{314}$ drawn through the transistor 314 are given by:

$$\text{VSWL}=V_{CC}-R_{302}\times((V_{BG}-V_{BE,310})/R_{306})\ \text{VSWU}=V_{CC}-R_{304}\times(V_{BG}/R_{308})\ I_{314}=V_{BG}/R_{308}$$

where $R_{302}$, $R_{304}$, $R_{306}$, and $R_{308}$ represent the resistances of the resistors 302, 304, 306 and 308 respectively. In one preferred embodiment, the resistors 302, 304, 306 and 308 have resistances of 1.6 kΩ, 800Ω, 1.6 kΩ, and 1.33 kΩ, respectively.

The base-emitter voltage $V_{BE}$ typically has a negative thermal coefficient such that $V_{BE}$ decreases with an increase in temperature. The VSWL being equal to $\{V_{CC} -R_{302} \times((V_{BG}-V_{BE,310})/R_{306})\}$ thus decreases with an increase in temperature. If $R_{302}=R_{306}$, then:

$$\text{VSWL}=V_{CC}-V_{BG}+V_{BE,310}$$

Because $V_{MIN}$, the minimum voltage at the clamped nodes 24, 34, is (VSWL$-V_{BE, 30/40}$) and assuming $V_{BE,310}$ equals to and has the same thermal coefficient as $V_{BE, 30/40}$, $V_{MIN}$ is equal to $V_{CC}-V_{BG}$, which is constant relative to temperature.

With respect to VSWU which is equal to $\{V_{CC} -R_{304}\times(V_{BG}/R_{308})\}$, all terms for VSWU are constant relative to changes in temperature, VSWU is also constant with changes in temperature. Thus, because $V_{MAX}$, the maximum voltage at the clamped nodes 24, 34 is VSWU, $V_{MAX}$ is constant relative to temperature.

Figure 4:
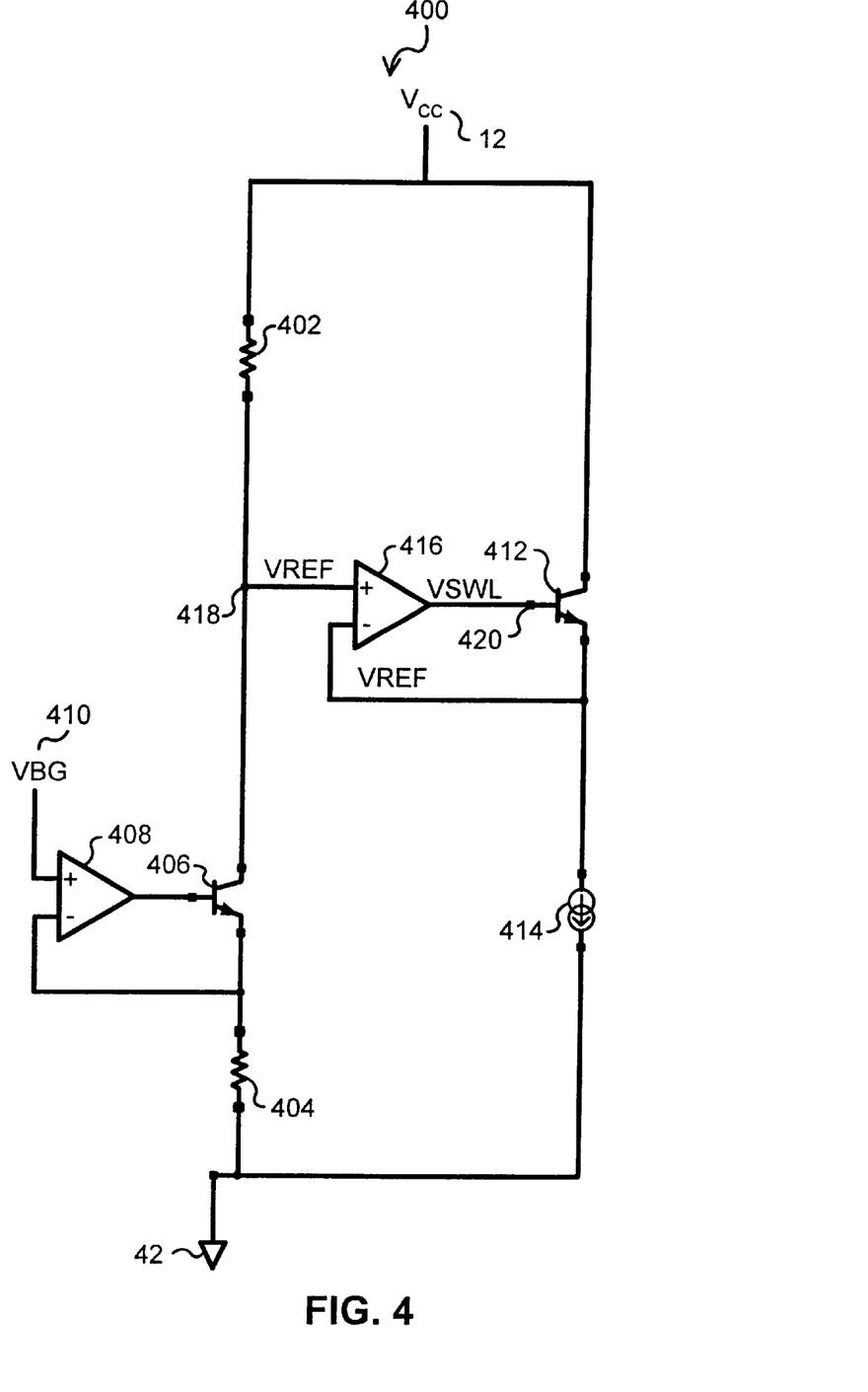
FIG. 4 is a circuit diagram of an alternative circuit for generating VSWL and VSWU.

FIG. 4 is a circuit diagram of an alternative circuit 400 for generating the lower clamp input voltage VSWL. The input voltage generation circuit 400 is also coupled between the power supply 12 and ground 42. The input voltage generation circuit 400 generally comprises resistors 402, 404 coupled to the power supply 12 and ground 42, respectively, and a bipolar junction transistor 406 having its collector, emitter and base coupled to resistors 402, 404 and output from an amplifier 408, respectively. The amplifier 408 has $V_{BG}$ band gap voltage 410 as its non-inverting input and a feedback from the base node of the transistor 406 as its inverting input. The input voltage generation circuit 400 further comprises a bipolar junction transistor 412 having its collector, emitter and base coupled to $V_{CC}$ of the power supply 12, a current source 414, and output from an amplifier 416, respectively. The amplifier 416 has VREF taken at node 418 as its non-inverting input and a feedback from the base node of the transistor 412 as its inverting input. Node 418 is coupled between resistor 402 and the collector node of bipolar junction transistor 406. Thus, the voltage VREF taken at node 418, the input lower clamp voltage VSWL taken at node 420, and currents $I_{406}$ and $I_{414}$ drawn through the transistor 406 and the current source 414, respectively, are given by:

$$V_{REF}=V_{CC}-R_{402}\times(V_{BG}/R_{404})$$

$$\text{VSWL}=V_{REF}+V_{BE,412}$$

$$I_{406}=V_{BG}/R_{404}$$

$$I_{414}=I/2$$

where I is the amplitude of the current through the tail current source 18 (FIG. 1) and where $R_{402}$, $R_{404}$ represent the resistances of the resistors 402 and 404, respectively. In one preferred embodiment, the resistors 402 and 404 have resistances of 800 Ω and 1.33 kΩ, respectively.

Figure 5:
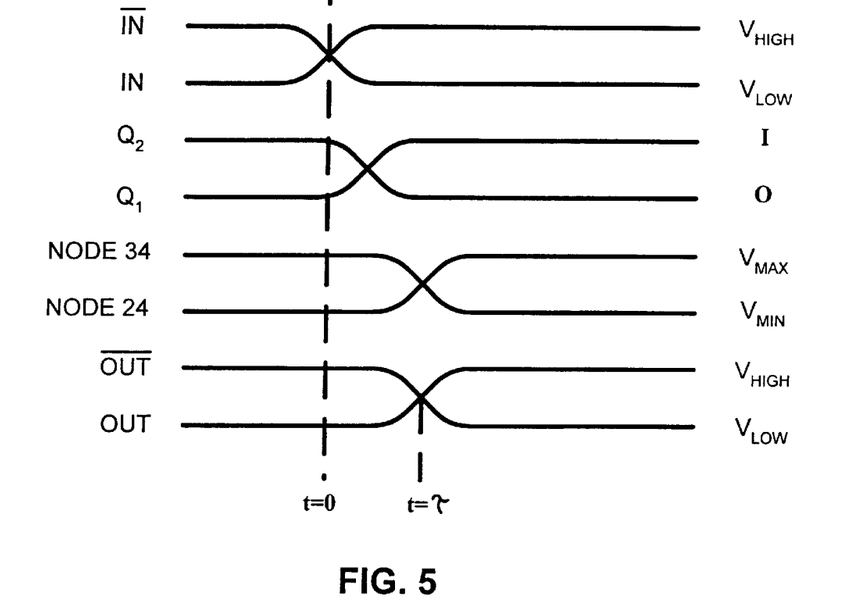
FIG. 5 is a timing diagram of the current and voltage characteristics of the delay circuit.

The operation of the delay circuit 10 will now be described in more detail with reference to FIGS. 1 and 5. As shown in FIG. 5, prior to t=0, input IN to the first input receiver 22 is $V_{LOW}$ while the second input $\overline{\text{IN}}$ to the second input receiver 32 is $V_{HIGH}$. This input state results in the first input receiver 22 being off or open and the second input receiver 32 being on or closed.

With the first input receiver 22 off, the current $Q_1$, through the first input receiver 22 is 0 and current I/2 from the first current source 28 flows from the first branch 14 to the third branch 20 via first current diverter 44. With the second input receiver 32 on allowing current to flow therethrough, a current of I/2 flows through the first current source 28 flows to the tail current source 18. Current does not flow through the second current diverter 46. For a total current of I through the upper clamp current source 50, the upper limit clamp 48 is on with an upper limit input voltage VSWU is applied thereto such that an additional current of I/2 flows to the upper clamp current source 50 via the third branch 20. Thus, a total current of I, one-half from the second current source 38 and one-half from the upper limit clamp 48, flows through the upper clamp current source 50.

During the steady-state period prior to t=0, the first capacitor 26 on the first branch 14 is charged by the supply voltage $V_{CC}$ of the power supply 12 and the voltage at the first clamped node 24 is at $V_{MAX}$. $V_{MAX}$ is the voltage $V_{CC}$ of the power supply 12 less the voltage drop across the collector-base junction of the upper limit clamp 48, less the voltage drop $V_{BE, 48}$ across the base-emitter junction of the upper limit clamp 48, and less the negative voltage drop $-V_{BE, 44}$ across the first current diverter 44. Preferably, the first current diverter 44 is a bipolar junction transistor with the base coupled to the collector. Further, the base-emitter junctions of the first current diverter 44 and upper limit clamp 48 are preferably of generally identical construct such that $V_{BE,44}$ equals $V_{BE,48}$ and such that the negative voltage drop across the first current diverter 44 cancels the voltage drop across the base-emitter junction of the upper limit clamp 48. Thus, $V_{MAX}$ is $V_{CC}$ less the voltage drop across the collector-base junction of the upper limit clamp 48 or, in other words, $V_{MAX}$ is equal to the input voltage VSWU to the upper limit clamp 48.

Referring again to the first branch 14, the input voltage VSWL to the first lower limit clamp 30 is less than the voltage $V_{MAX}$ or VSWU at the first clamped node 24. As such, the voltage across the base-emitter junction $V_{BE, 30}$ of the first lower limit clamp 30 is below the threshold base-emitter voltage and the first lower limit clamp 30 is off. Thus, during the period prior to t=0, the first lower limit clamp 30 does not contribute current flow through the first branch 14 nor affect the voltage at the first clamped node 24.

With respect to the second branch 16 during the steady-state period prior to t=0, current does not flow through the second current diverter 46. Rather, current flows through the second branch 16 to the tail current source 18. The tail current source 18 pulls a current I through the second branch 16 such that the current $Q_2$ through the second input receiver 32 is I, one-half of which is through the second current source 38 and one-half of which is through the second lower limit clamp 40. Prior to the time shown in FIG. 5, the second capacitor 36 is drained by the current flow through the second branch 16 to the tail current source 18 until the second clamped node 34 reaches a voltage sufficiently low to turn on the second lower limit clamp 40. Once the second lower limit clamp 40 turns on, the tail current source 18 draws a current I/2 from the second lower limit clamp 40 and stops drawing current through the second capacitor 36 such that the voltage at the second clamped node 34 remains at the voltage at which the second lower limit clamp 40 turns on.

Because the second lower limit clamp 40 is on, the voltage at the second clamped node 34 is equal to the input VSWL to the second lower limit clamp 40 less the threshold voltage $V_{BE,\ 40}$ across the base-emitter junction of the second lower limit clamp 40. The second lower limit clamp 40 thus serves to limit or clamp the voltage at the second clamped node 34 to a minimum voltage $V_{MIN}$ equal to VSWL less the threshold base-emitter voltage $V_{BE,\ 40}$ of the second lower limit clamp 40. Typically, the threshold base-emitter voltage in the relatively high range of current flow through the lower limit clamps 30, 40 is approximately 0.75 V.

As shown in FIG. 5, at t=0, the voltage input IN to the first input receiver 22 transitions from $V_{LOW}$ to $V_{HIGH}$ and the input $\overline{IN}$ to the second input receiver 32 transitions from $V_{HIGH}$ to $V_{LOW}$. This input transition turns the first input receiver 22 on and the second input receiver 32 off. With the first input receiver 22 on, current through the first branch 14 flows to the tail current source 18 and is no longer diverted through the first current diverter 44. In contrast, with the second input receiver 32 off, current through the second branch 16 is diverted through the second current diverter 46 and no longer flows to the tail current source 18. Thus, after a short delay, the current $Q_1$ through the first input receiver 22 transitions from 0 to I and the current $Q_2$ through the second input receiver 32 transitions from I to 0.

Because the delay circuit 10 is differentially coupled, the input IN is opposite in phase to input $\overline{IN}$ such that only one of the first and second input receivers 22, 32 is on. The differential inputs operates to steer the current through the tail current source 18 through either the first branch 14 or the second branch 16 in discharging the timing capacitors 26, 36. This results in the tail current source 18, which is constantly pulling a current of I, drawing current from either the first branch 14 or the second branch 16, depending upon the state of the inputs IN, $\overline{IN}$. Further, the upper clamp current source 50, which is also constantly pulling a current of I, draws current from either the first branch 14 or the second branch 16 as well as the upper limit clamp 48, also depending upon the state of the inputs IN, $\overline{IN}$.

The voltage coupling of the emitter node of the upper limit clamp 48 is also affected by the state of the inputs. Specifically, the emitter node of the upper limit clamp 48 is coupled to the first clamped node 24 via the first current diverter 44 when the input IN is low, such as prior to the transition at t=0. After the transient effects of the input transition, the emitter node of the upper limit clamp 48 is coupled to the second clamped node 34 via the second current diverter 46 when the input $\overline{IN}$ is low. Thus, the voltage coupling at the emitter node of the upper limit clamp 48 is also dependent upon the state of the inputs IN, $\overline{IN}$.

Because the tail current source 18 pulls a current I and the first current source 28 provides only one-half of current I, another current of amplitude I/2 must be provided through the first branch 14, i.e., through the first capacitor 26 and/or the first lower limit clamp 30. At the time of input state transition, the first capacitor 26 is charged and the voltage at the first clamped node 24 is at $V_{MAX}$ such that the first lower limit clamp 30 is off. Thus, the tail current source 18 initially pulls a current of I/2 from the charged first capacitor 26.

After the input state transition at t=0, the first capacitor 26 begins to drain after some delay to provide a current flow of I/2 to the tail current source 18. As shown in the timing diagram of FIG. 5, as the charge on the first capacitor 26 drains, the voltage at the first clamped node 24 begins to decrease from $V_{MAX}$ to $V_{MIN}$ and then output voltage at the first output node 54 begins to decrease from $V_{HIGH}$ to $V_{LOW}$. The delay $\tau$ of the delay cell 10 is measured from the midpoint of the transition of the input voltages IN, $\overline{IN}$ between $V_{HIGH}$ and $V_{LOW}$ to the midpoint of the transition of the input voltages OUT, $\overline{OUT}$ between $V_{HIGH}$ and $V_{LOW}$. The length of delay $\tau$ is dependent upon the amplitude of the current I, upon the capacitance of the first timing capacitor 26, and upon the voltage swing inputs VSWL and VSWU.

When the voltage at the first clamped node 24 reaches $V_{MIN}$, equal to VSWL less the threshold $V_{BE,\ 30}$ voltage of the first lower limit clamp 30, the first lower limit clamp 30 turns on because the base-emitter voltage of the first lower limit clamp 30 is equal to the threshold $V_{BE,\ 30}$ voltage. When the first lower limit clamp 30 turns on, the tail current source 18 pulls a current of I/2 through the first lower limit clamp 30 and no longer pulls current through the first capacitor 26. The charge on the first capacitor 26 thus stops draining and the voltage at the first clamped node 24 remains at $V_{MIN}$. As is evident, the first lower limit clamp 30 operates to prevent or clamp the voltage at the first clamped node 24 from decreasing below the minimum voltage, $V_{MIN}$.

With reference to the second branch 16, after the input $\overline{IN}$ to the second input receiver 32 transitions from high to low, the second input receiver 32 turns off. Current of I/2 through the second current source 38 is diverted from the second branch 16 to the upper clamp current source 50 via the second current diverter 46. At the time of the transition, the voltage at the second clamped node 34 is at $V_{MIN}$ and thus the upper limit clamp 48 remains on but coupled to the second branch 16 rather than the first branch 14 and supplies a current of I/2 to the upper clamp current source 50.

After the input state transition, the power supply 12 begins to charge the second capacitor 36 after some delay and the voltage at the second clamped node 34 begins to increase from $V_{MIN}$. After another short delay, the voltage OUT at the second output node 64 begins to increase from $V_{LOW}$. Increasing the voltage at the second clamped node 34 above $V_{MIN}$ turns off the second lower limit clamp 40 because the voltage across the base-emitter junction of the second clamp 40 becomes less than the threshold base-emitter voltage $V_{BE,\ 40}$. After a delay of $\tau$ since the midpoint of the input state transition at t=0, the rising voltage OUT at the second output node 64 has reached a midpoint between $V_{LOW}$ and $V_{HIGH}$.

When the voltage at the second clamped node 34 reaches $V_{MAX}$, the upper limit clamp 48 operates to limit or clamp the voltage at the second clamped node 34 to a maximum of $V_{MAX}$ and to limit the voltage OUT at the second output node 64 to a maximum of $V_{HIGH}$. Specifically, because the upper limit clamp 48 must remain on to allow the upper clamp current source 50 to draw a current of I/2 through the upper limit clamp 48, the voltage at the second clamped node 34 must be at a maximum of $V_{MAX}$ equal to VSWU in order for the base-emitter voltage of the upper limit clamp 48 to be equal to the threshold base-emitter voltage $V_{BE,48}$. In other words, the voltage on the second timing capacitor 36 charges until it is clamped by the circuit formed by the second current diverter 46, the upper limit clamp 48 and its input voltage VSWU, and the upper limit current source 50.

Although FIG. 5 only shows a single transition from low to high of the first input IN, and a single transition from high to low of the second input $\overline{IN}$, it is to be understood that the inputs IN, $\overline{IN}$ are preferably continually or continuously transitioning between high and low voltages. Further, the parameters of the first and second timing capacitors 26, 36 are selected according to the frequency of the input state transitions.

Table I summarizes the states of some of the parameters of the delay circuit 10 at times prior to=0 and after t=τ.

TABLE I

| Parameter | Prior to t = 0 | After t = τ |
|---|---|---|
| IN | Low | High |
| $\overline{IN}$ | High | Low |
| First Lower Limit Clamp 30 | Off | On |
| Second Lower Limit Clamp 40 | On | Off |
| Upper Limit Clamp 48 | On | On |
| First Timing Capacitor 26 | Charged | Drained |
| Second Timing Capacitor 36 | Drained | Charged |
| First Current Diverter 44 | Current Flow | No Current Flow |
| Second Current Diverter 46 | No Current Flow | Current Flow |
| Node 24 | $V_{MAX}$ = VSWU | $V_{MIN}$ = VSWL-$V_{BE}$ |
| Node 34 | $V_{MIN}$ = VSWL-$V_{BE}$ | $V_{MAX}$ = VSWU |
| OUT | $V_{HIGH}$ = VSWU-$V_{BE}$ | $V_{LOW}$ = VSWL-2$V_{BE}$ |
| $\overline{OUT}$ | $V_{LOW}$ = VSWL-2$V_{BE}$ | $V_{HIGH}$ = VSWU-$V_{BE}$ |

Figure 6:
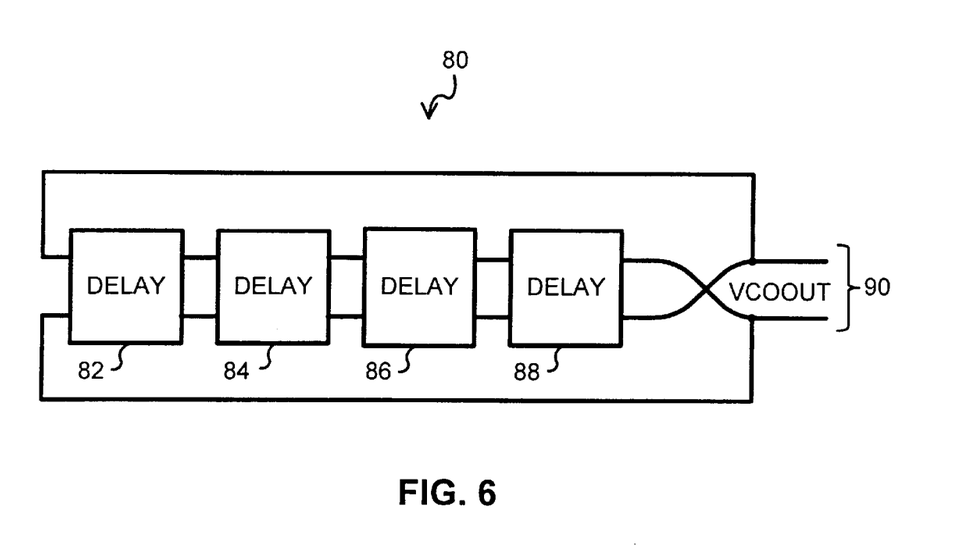
FIG. 6 is a schematic of a four-stage differential ring oscillator implementation of VCO.

FIG. 6 shows a four-stage differential ring oscillator implementation of a VCO. The four stage differential ring oscillator 80 comprises four delay stages 82, 84, 86, 88. Preferably each of the four delay stages is identical in construction and produces the same delay. Each delay stage receives a first and second input and a first and second output. The first and second inputs are of same amplitude but opposite in phase and the outputs are similarly of same amplitude but opposite in phase. The first and second outputs of each of delay stages 82, 84, 86 are the first and second inputs of each of delay stages 84, 86, 88, respectively. The first and second outputs of the last delay stage 88 are fed back as the second and first inputs of the first delay stage 82. The first and second outputs of the last delay stage 88 are also the first and second outputs vcoout 90 of the four-stage differential ring oscillator 80. Such differential feed back of the outputs of the last delay stage to the inputs of the first delay stage results in the frequency of the VCO output signal being 1/(2× number of delay stages×delay of each delay stage).

While the preferred embodiments of the present invention are described and illustrated herein, it will be appreciated that they are merely illustrative and that modifications can be made to these embodiments without departing from the spirit of the invention. Thus, the invention is intended to be defined only in terms of the following claims.

What is claimed is:

1. A delay cell, comprising:
   a first input receiver on a first branch for receiving a first input to control a first current on the first branch, the first branch having a first output node capacitively coupled to a power supply node;
   a second input receiver on a second branch for receiving a second input to control a second current on the second branch, the second branch having a second output node capacitively coupled to said power supply node;
   a first current source coupled between the first output node and said power supply node;
   a second current source coupled between the second output node and said power supply node; and
   a first current diverter coupled to the first branch for diverting current on the first branch away from the first input receiver and a second current diverter coupled to the second branch for diverting current on the second branch away from the second input receiver,
   wherein each of the first and second current diverters is a diode.

2. A delay cell, comprising:
   a first input receiver on a first branch for receiving a first input to control a first current on the first branch, the first branch having a first output node capacitively coupled to a power supply node;
   a second input receiver on a second branch for receiving a second input to control a second current on the second branch, the second branch having a second output node capacitively coupled to said power supply node;
   a first current source coupled between the first output node and said power supply node;
   a second current source coupled between the second output node and said power supply node;
   a first current diverter coupled to the first branch for diverting current on the first branch away from the first input receiver and a second current diverter coupled to the second branch for diverting current on the second branch away from the second input receiver, and
   an upper limit clamp coupled between said power supply node and the first and second current diverters for maintaining each of a first output at the first output node and a second output at the second output node below an upper limit.

3. The delay cell of claim 2, further comprising an upper clamp input generated relative to said power supply node and supplied to the upper limit clamp.

4. The delay cell of claim 2, further comprising an upper clamp current source coupled between ground and the first and second current diverters.

5. The delay cell of claim 2, further comprising:
   a first clamp coupled between the first output node and said power supply node for maintaining a first output at the first output node above a lower limit;
   a second clamp coupled between the second output node and said power supply node for maintaining a second output at the second output node above the lower limit; and
   a tail current source coupled between ground and the first and second input receivers.

6. A method for generating a delay, comprising:
   inputting a first input to a first input receiver on a first branch to control a first current on the first branch;
   inputting a second input into a second input receiver on a second branch to control a second current on the second branch;

providing a first current source to supply current on the first branch;

providing a second current source to supply current on the second branch;

outputting a first output at a first output node on the first branch, the first output node being capacitively coupled to a power supply node; and outputting a second output at a second output node on the second branch, the second output node being capacitively coupled to said power supply node, applying a first lower limit input to a first clamp coupled between the first output node and said power supply node for maintaining a first output at the first output node above a first lower limit;

applying a second lower limit input to a second clamp coupled between the second output node and said power supply node for maintaining a second output at the second output node above a second lower limit;

diverting current on the first branch from the first input receiver to a first current diverter; and diverting current on the second branch from the second input receiver to a second current diverter, wherein each of the first and second current diverters is a diode.

7. A method for generating a delay, comprising:

inputting a first input to a first input receiver on a first branch to control a first current on the first branch;

inputting a second input into a second input receiver on a second branch to control a second current on the second branch;

providing a first current source to supply current on the first branch;

providing a second current source to supply current on the second branch;

outputting a first output at a first output node on the first branch, the first output node being capacitively coupled to a power supply node; and outputting a second output at a second output node on the second branch, the second output node being capacitively coupled to said power supply node, applying a first lower limit input to a first clamp coupled between the first output node and said power supply node for maintaining a first output at the first output node above a first lower limit;

applying a second lower limit input to a second clamp coupled between the second output node and said power supply node for maintaining a second output at the second output node above a second lower limit;

diverting current on the first branch from the first input receiver to a first current diverter;

diverting current on the second branch from the second input receiver to a second current diverter; and applying an upper limit input to an upper limit clamp coupled between said power supply node and the first and second current diverters for maintaining the first and second outputs below an upper limit.

8. The method for generating a delay of claim 7, further comprising an upper clamp current source to supply current between the first and second diverters and ground.

9. The method for generating a delay of claim 7, wherein the upper limit clamp is a bipolar junction transistor.

10. The method for generating a delay of claim 9, wherein the first lower limit input, the second lower limit input, and the upper limit input are generated relative to said power supply node.

11. A differential ring oscillator, comprising a first delay cell, one or more intermediate delay cells, and a last delay cell, each delay cell adapted to receive a first input and a second input and each delay cell having a first output node and a second output node, the delay cells being configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively, each delay cell comprising:

a first input receiver on a first branch for receiving the first input to control a first current on the first branch, the first branch having the first output node capacitively coupled to a power supply node;

a second input receiver on a second branch for receiving the second input to control a second current on the second branch, the second branch having the second output node capacitively coupled to said power supply node;

a first current source coupled between the first output node and said power supply node;

a second current source coupled between the second output node and said power supply node; and a first current diverter coupled to the first branch for diverting current from the first branch away from the first input receiver and a second current diverter coupled to the second branch for diverting current from the second branch away from the second input receiver, wherein each of the first and second current diverters is a diode.

12. A differential ring oscillator, comprising a first delay cell, one or more intermediate delay cells, and a last delay cell, each delay cell adapted to receive a first input and a second input and each delay cell having a first output node and a second output node, the delay cells being configured in a sequential ring configuration such that the first and second output nodes of the last delay cell are coupled to the second and first inputs of the first delay cell, respectively, and the first and second output nodes of each of the first and intermediate delay cells are coupled to the first and second inputs of a subsequent delay cell comprising the intermediate and the last delay cells, respectively, each delay cell comprising:

a first input receiver on a first branch for receiving the first input to control a first current on the first branch, the first branch having the first output node capacitively coupled to a power supply node;

a second input receiver on a second branch for receiving the second input to control a second current on the second branch, the second branch having the second output node capacitively coupled to said power supply node;

a first current source coupled between the first output node and said power supply node;

a second current source coupled between the second output node and said power supply node;

a first current diverter coupled to the first branch for diverting current from the first branch away from the first input receiver and a second current diverter coupled to the second branch for diverting current from the second branch away from the second input receiver; and an upper limit clamp coupled between said power supply node and the first and second current diverters for maintaining the first and second outputs below an upper limit.

13. The differential ring oscillator of claim 12, further comprising a third clamp input to the third clamp, wherein the third clamp is a transistor and the third clamp input is coupled to said power supply node.

14. The differential ring oscillator of claim 12, each delay cell further comprising a current source coupled between ground and the first and second current diverters.

* * * * *